(12) United States Patent
Lee et al.

(10) Patent No.: US 7,405,098 B2
(45) Date of Patent: Jul. 29, 2008

(54) SMOOTH SURFACE LIQUID PHASE EPITAXIAL GERMANIUM

(75) Inventors: Jong-Jan Lee, Camas, WA (US); Jer-Shen Maa, Vancouver, WA (US); Douglas J. Tweet, Camas, WA (US); David R. Evans, Beaverton, OR (US); Allen Burmaster, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 337 days.

(21) Appl. No.: 11/339,017

(22) Filed: Jan. 25, 2006

(65) Prior Publication Data
US 2006/0194418 A1 Aug. 31, 2006

Related U.S. Application Data

(63) Continuation-in-part of application No. 11/261,191, filed on Oct. 28, 2005, now Pat. No. 7,276,392, and a continuation-in-part of application No. 11/240,969, filed on Sep. 30, 2005, now Pat. No. 7,186,611, and a continuation-in-part of application No. 11/174,035, filed on Jul. 1, 2005, now Pat. No. 7,271,023, and a continuation-in-part of application No. 11/069,424, filed on Feb. 28, 2005, now Pat. No. 7,008,813.

(51) Int. Cl.
H01L 21/00 (2006.01)
H01L 21/84 (2006.01)
H01L 21/331 (2006.01)
H01L 21/76 (2006.01)
H01L 21/20 (2006.01)
H01L 21/36 (2006.01)

(52) U.S. Cl. .................. 438/48; 438/164; 438/341; 438/413; 438/479

(58) Field of Classification Search .................. 438/149, 438/479–480, 699–706
See application file for complete search history.

(56) References Cited

U.S. PATENT DOCUMENTS 4,260,396 A   4/1981   Glemza ..................... 51/298

(Continued)

OTHER PUBLICATIONS

Yaocheng Liu, Michael D. Deal, and James D. Plummer, "High quality single-crystal Ge on insulator by liquid-phase epitaxy on Si substrate," Applied Physics Letters, vol. 84, No. 14, pp. 2563-2565, 2004.

*Primary Examiner*—Cuong Q Nguyen
(74) *Attorney, Agent, or Firm*—Law Office of Gerald Maliszewski; Gerald Maliszewski (57) ABSTRACT

A method is provided for forming a liquid phase epitaxial (LPE) germanium (Ge)-on-insulator (GOI) thin-film with a smooth surface. The method provides a silicon (Si) wafer, forms a silicon nitride insulator layer overlying the Si wafer, and selectively etches the silicon nitride insulator layer, forming a Si seed access region. Then, the method conformally deposits Ge overlying the silicon nitride insulator layer and Si seed access region, forming a Ge layer with a first surface roughness, and smoothes the Ge layer using a chemical-mechanical polish (CMP) process. Typically, the method encapsulates the Ge layer and anneals the Ge layer to form a LPE Ge layer. A Ge layer is formed with a second surface roughness, less than the first surface roughness. In some aspects, the method forms an active device in the LPE Ge layer.

19 Claims, 8 Drawing Sheets

U.S. PATENT DOCUMENTS

| | | | |
|---|---|---|---|
| 5,943,560 A | 8/1999 | Chang et al. | 438/151 |
| 6,482,705 B1 | 11/2002 | Yu | 438/300 |
| 6,753,234 B1 | 6/2004 | Naem | 438/318 |
| 7,008,813 B1 * | 3/2006 | Lee et al. | 438/56 |
| 7,186,611 B2 * | 3/2007 | Hsu et al. | 438/237 |
| 7,271,023 B2 * | 9/2007 | Lee et al. | 438/48 |
| 7,276,392 B2 * | 10/2007 | Hsu et al. | 438/48 |
| 2006/0194357 A1 * | 8/2006 | Hsu et al. | 438/28 |
| 2007/0170536 A1 * | 7/2007 | Hsu et al. | 257/458 |

* cited by examiner

☒ Si Sub  ☒ SiN  ☐ Ge  ☒ SiO₂

Fig. 4

☒ Si Sub  ☒ SiN  ☐ Ge  ☒ N + Ge

Si | SiN | Ge | SiO₂

Fig. 13

SMOOTH SURFACE LIQUID PHASE EPITAXIAL GERMANIUM

RELATED APPLICATIONS

This application is a Continuation-in-Part of a pending patent application entitled, FLOATING BODY GERMANIUM PHOTOTRANSISTOR, Lee et al., Ser. No. 11/174,035, filed Jul. 01, 2005 now U.S. Pat. No. 7,271,023.

This application is a Continuation-in-Part of a pending patent application entitled, METHOD OF EPITAXIAL GROWTH OF GERMANIUM PHOTODETECTOR FOR CMOS IMAGER, Lee et al., Ser. No. 11/069,424, filed Feb. 28, 2005 now U.S. Pat. No. 7,008,813.

This application is a Continuation-in-Part of a pending patent application entitled, HIGH-DENSITY GERMANIUM-ON-INSULATOR PHOTODIODE ARRAY, Hsu et al., Ser. No. 11/240,969, filed Sep. 30, 2005 now U.S. Pat. No. 7,186,611.

This application is a Continuation-in-Part of a pending patent application entitled, FLOATING BODY GERMANIUM PHOTOTRANSISTOR WITH PHOTO ABSORPTION THRESHOLD BIAS REGION, Hsu et al., Ser. No. 11/261,191, filed Oct. 28, 2005 now U.S. Pat. No. 7,276,392.

This application claims priority to the above-mentioned parent applications under 35 U.S.C. 120, and expressly incorporates the parent applications by reference.

BACKGROUND OF THE INVENTION

1. Field of the Invention

This invention generally relates to integrated circuit (IC) processing and, more particularly, to a method for smoothing a liquid phase epitaxy (LPE) germanium (Ge) film.

2. Description of the Related Art

Ge-on-insulator (GOI) semiconductor devices can be fabricated by depositing Ge, etching the Ge into the desired shape, and depositing an insulator film to encapsulate the Ge features. During a LPE process the Ge melts, but the surface features of the Ge are maintained because the insulator remains solid. Conventionally, the deposited Ge film does not have smooth surface before the LPE process, and the resultant single-crystal Ge film surface retains the pre-LPE process roughness. Active devices (i.e., MOSFETs) built on a rough Ge single-crystal surface face several potential problems. Some of these problems are: (1) gate dielectric reliability; (2) an increase in gate dielectric leakage; and, (3) a decrease in carrier mobility due to surface scattering. While it is possible to smooth the surface after forming the Ge single-crystal film, it is generally acknowledged that the surface quality is improved if the surface can be smoothed prior to the Ge single-crystal formation.

Liu et al. (Yaocheng Liu, Michael D. Deal, and James D. Plummer, "High quality single-crystal Ge on insulator by liquid-phase epitaxy on Si substrate," Applied Physics Letters, vol. 84, no. 14, pp 2563-2565, 2004) described a technique to form single-crystal Ge on dielectric surface using liquid phase epitaxy. Polycrystalline or amorphous Ge was first deposited on an oxide or nitride surface. A small section of this dielectric layer was etched out to allow direct contact of Ge with the underneath Si surface. A rapid heating cycle caused the Ge film to melt. In the subsequent cooling step, a solidification or crystallization front moved from the region above the single crystal silicon seed and swept across the Ge film. With pre-etched Ge strips formed on an insulator, single-crystal Ge dislocation defects are limited to the Si/Ge seeding window.

In this technique, the Ge strip is enclosed by a dielectric layer. The imprint of the surface feature of the original Ge film remains on the surface after the conversion from polycrystalline or amorphous phase, to the single-crystal phase. In order to form very smooth single-crystal Ge film, the polycrystalline or amorphous Ge film must be very smooth before the LPE process.

A smooth Ge film can be deposited easily by physical vapor deposition (PVD). It would be desirable from a commercial fabrication point of view however, to deposit Ge film using a chemical vapor deposition (CVD) process. It is difficult to deposit a very smooth Ge film by CVD on dielectric layer, due to the low melting temperature of Ge.

Figure 1A:
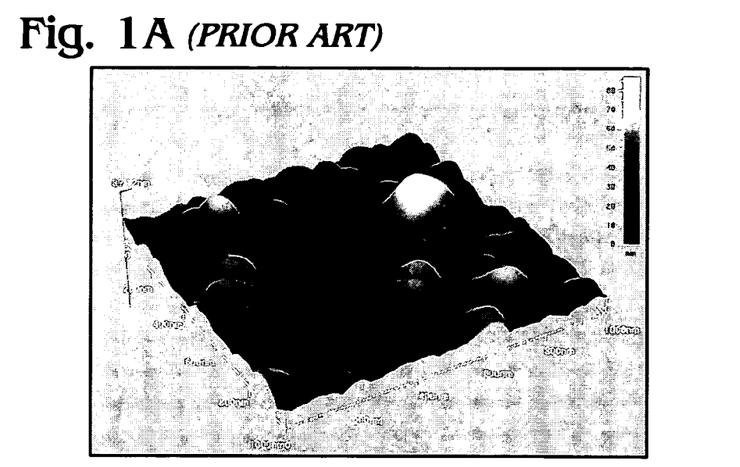
FIGS. 1A and 1B are drawings depicting the surface roughness of a Ge film formed using a CVD process at 260° C. (prior art).
Figure 1B:
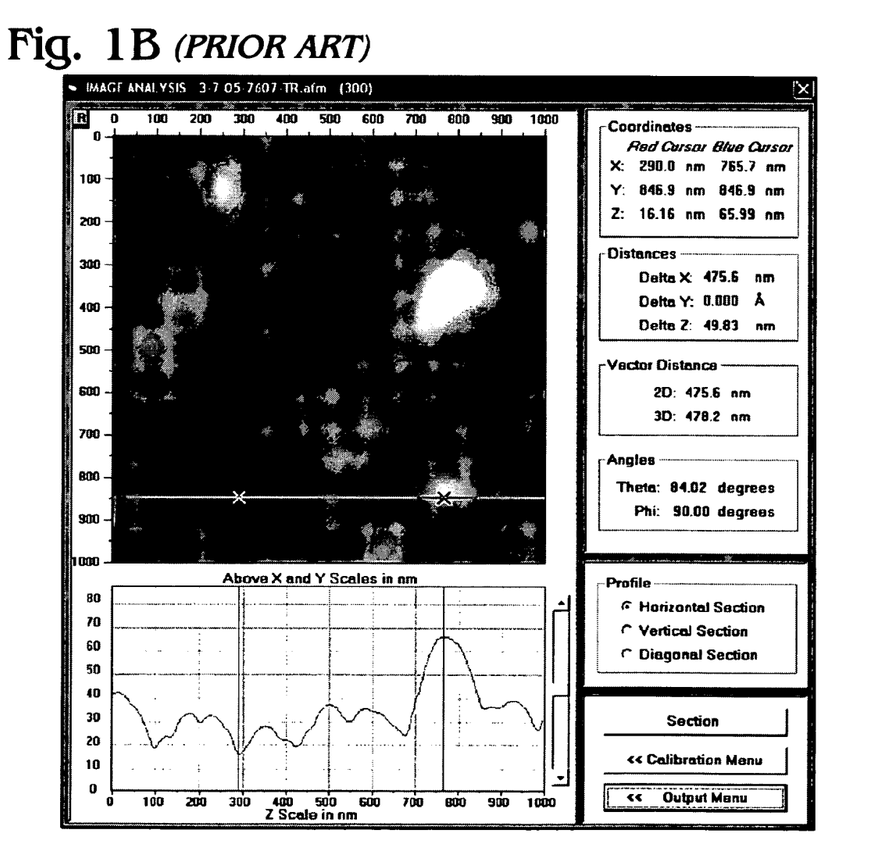

FIG. 1A and 1B are drawings depicting the surface roughness of a Ge film formed using a CVD process at 260° C. (prior art). FIG. 1A is an atomic force micrograph of Ge film. The Ge was deposited on a nitride surface by chemical vapor deposition at about 260° C. The Ge thickness is about 170 nanometers (nm). FIG. 1B is line scan analysis of the atomic force micrograph. The Ge grain size is about 100 nm to 200 nm, the peak-to-valley roughness is as high as 50 nm.

Figure 2A:
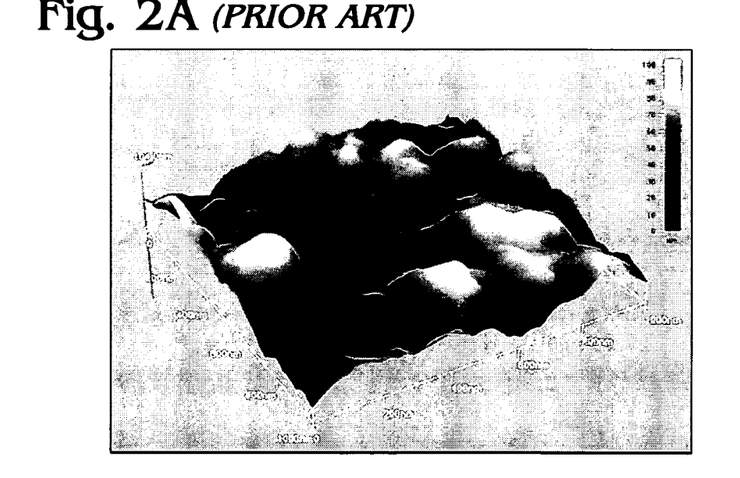
FIGS. 2A and 2B are drawings depicting the surface roughness of a Ge film deposited using a CVD process at 520° C. with a 3 nm Si buffer layer (prior art).
Figure 2B:
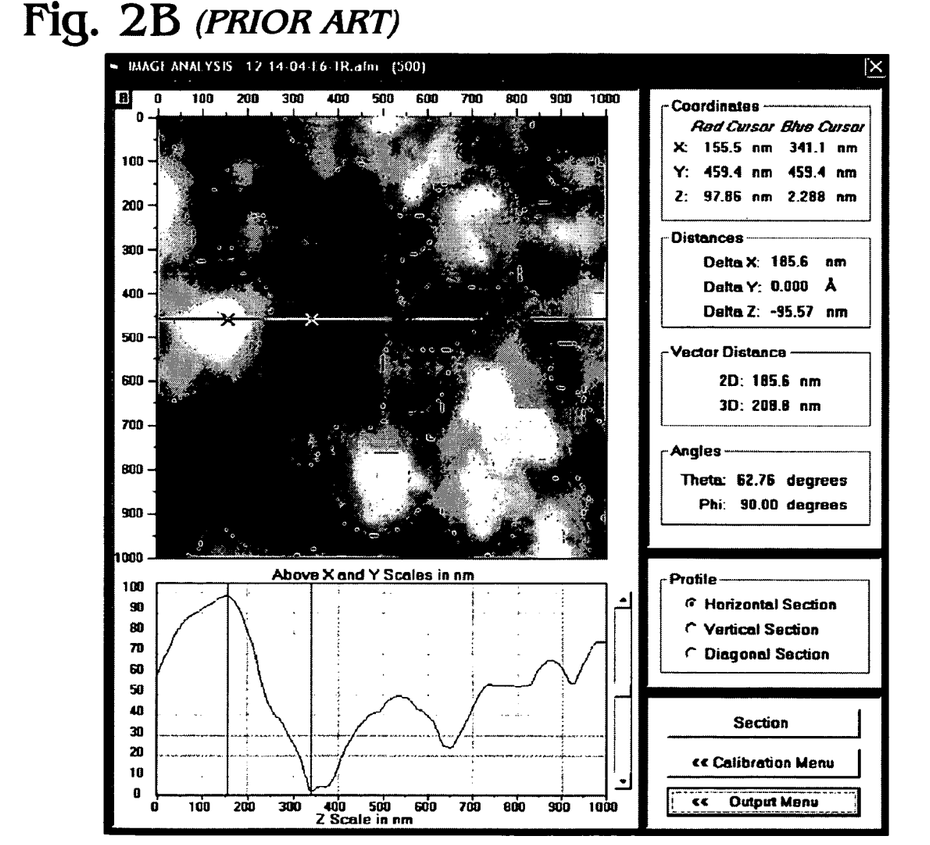

FIGS. 2A and 2B are drawings depicting the surface roughness of a Ge film deposited using a CVD process at 520° C. with a 3 nm Si buffer layer (prior art). FIG. 2A is an atomic force micrograph of a Ge film. 320 nm of Ge was deposited on a nitride surface at about 520° C. Even with a 3 nm buffer Si to improve roughness, the surface is still very rough. FIG. 2B is a line scan analysis of the atomic force micrograph. The peak-to-valley roughness is more than 90 nm. A comparison of FIGS. 1 and 2 reveals that the Ge film surface roughness is a more serious problem at higher deposition temperatures. However, the films of FIGS. 1 and 2 are both too rough for the fabrication of electronic devices on a liquid phase epitaxy Ge film.

Conventionally, chemical mechanical polishing (CMP) has been applied to improve the surfaces of polycrystalline silicon, as well as silicon-germanium films in the fabrication of thin-film transistors. CMP processes are widely used in IC industry, particularly to smooth dielectric or metal layers. However, there are no conventional processes for polishing a germanium thin-film. Additionally, there are no reports addressing the issue of smoothing single-crystal germanium films formed through liquid phase epitaxy.

SUMMARY OF THE INVENTION

The present invention describes a method for improving the surface smoothness of a Ge film, so that a high purity Ge film formed by chemical vapor deposition, can be used for single-crystalline Ge films fabricated with a liquid phase epitaxy process. As a result, Ge-based thin-film transistors and low defect single-crystal Ge optical sensors can be fabricated on the smooth LPE Ge film.

The Ge film can be formed by chemical vapor deposition on a dielectric layer. The surface of the as-deposited Ge film is polished by chemical mechanical polish. After liquid phase epitaxy, the surface of the single crystal Ge remains very smooth. The present invention introduces a novel slurry for this application.

Accordingly, a method is provided for forming a liquid phase epitaxial (LPE) germanium (Ge)-on-insulator (GOI) thin-film with a smooth surface. Electronic devices, such as MOSFETs and photodetectors can then be fabricated on the smooth surface of this GOI thin-film. The method provides a silicon (Si) wafer, forms a silicon nitride insulator layer overlying the Si wafer, and selectively etches the silicon nitride insulator layer, forming a Si seed access region. Then, the method conformally deposits Ge overlying the silicon nitride insulator layer and Si seed access region, forming a Ge layer with a first surface roughness, and smoothes the Ge layer using a chemical-mechanical polish (CMP) process. Typically, the method encapsulates the Ge layer and anneals the Ge layer to form a single-crystal Ge layer through an LPE process. A Ge layer is formed with a second surface roughness, less than the first surface roughness. In some aspects, the method selectively dopes the LPE Ge layer, and forms an active device in the LPE Ge layer.

For example, the method may form a Ge layer with a thickness in the range of about 20 to 1000 nanometers (nm) and a first surface roughness of greater than about 5 nm. Then, the method forms a second surface roughness of less than about 5 nm, in response to the CMP. The CMP process uses a colloidal silica slurry with a particle size of about 50 nm or less. Typically, the slurry that is about 30% or less, solids, with a pH of about 9, or greater. In one aspect, the CMP process uses a down force in the range of about 1 to 10 pound-force per square inch (psi).

Additional details of the above-described method are provided below.

DETAILED DESCRIPTION

A Ge MOSFET device built upon an insulator structure takes advantage of the floating body effect for improved amplification of a photodetector signal. The Ge epitaxial film is formed by liquid phase epitaxial regrowth. However, the floating body effect associated with a Ge MOS phototransistor is also applicable to any device fabricated on germanium-on-insulator (GOI) wafers.

The floating body model for an SOI device depicts a body that is capacitively coupled, through separate capacitors, to the gate, drain, source, and substrate. A more complex model envisions a parasitic bipolar transistor with a base connected to the body, an emitter and collector connected to the source and drain, and a parallel connected back transistor with a gate connected to the substrate.

Figure 3:
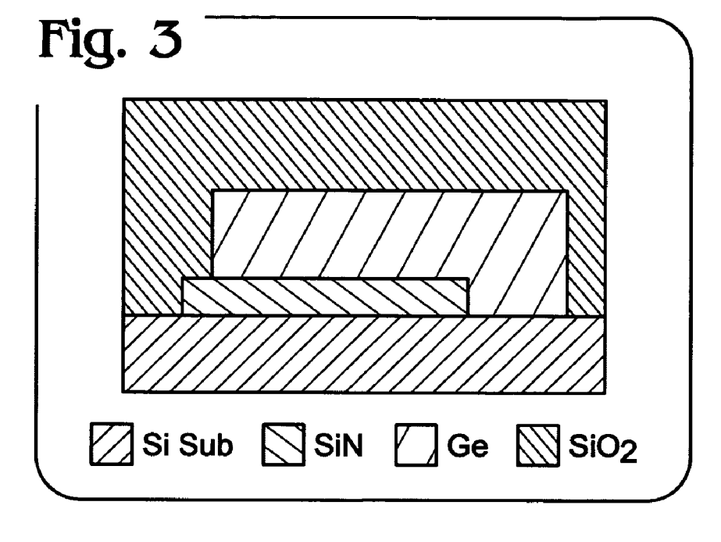
FIG. 3 is a partial cross-sectional view of a Ge phototransistor fabrication step that uses dielectrics to encapsulate the Ge for the purpose of a LPE process.

FIG. 3 is a partial cross-sectional view of a Ge phototransistor fabrication step that uses dielectrics to encapsulate the Ge for the purpose of a LPE process. Silicon nitride is used as an insulator layer. However, other insulator materials can also be used. The insulator is deposited on a Si wafer and then patterned. The silicon nitride layer thickness is between 10 nm to 500 nm. Ge is then deposited non-selectively. The Ge thickness is between 20 nm to 1000 nm. The Ge deposition method can be CVD (chemical vapor deposition), PVD (physical vapor deposition), MBE (Molecule Beam Epitaxy), or any other suitable thin film deposition method. At this point, a CMP process is used to smooth the surface of the Ge film. Details of the CMP process are proved in detail below. Next, the Ge film is patterned and etched into desired features. These features may include a small area of Ge directly on top of the Si substrate, as shown. This area works as a seed window for the Ge epitaxial process. Then, a conformal dielectric layer (20 nm to 1000 nm) is deposited to encapsulate the Ge film. Rapid thermal annealing (RTA) is used to heat up the wafer and melt the Ge film. For example, silicon oxide or silicon nitride can be used as the dielectric layer. The melting temperature for crystalline Ge is 938° C., so the RTA temperature is usually between 920° C. to 1000° C. During this anneal, the Ge film melts, and the dielectric insulators encapsulating the Ge act as microcrucibles, keeping the Ge liquid from flowing randomly. The Si substrate, the underlying insulator, and the overlying dielectric remain solid. The wafer is then cooled down naturally. While the Ge liquid is cooling, liquid phase epitaxy (LPE) occurs, with the growth front starting from the Si/Ge interface in the seeding windows, propagating laterally. Finally, single crystalline Ge is formed with defects concentrated and terminated at the seeding window.

Figure 4:
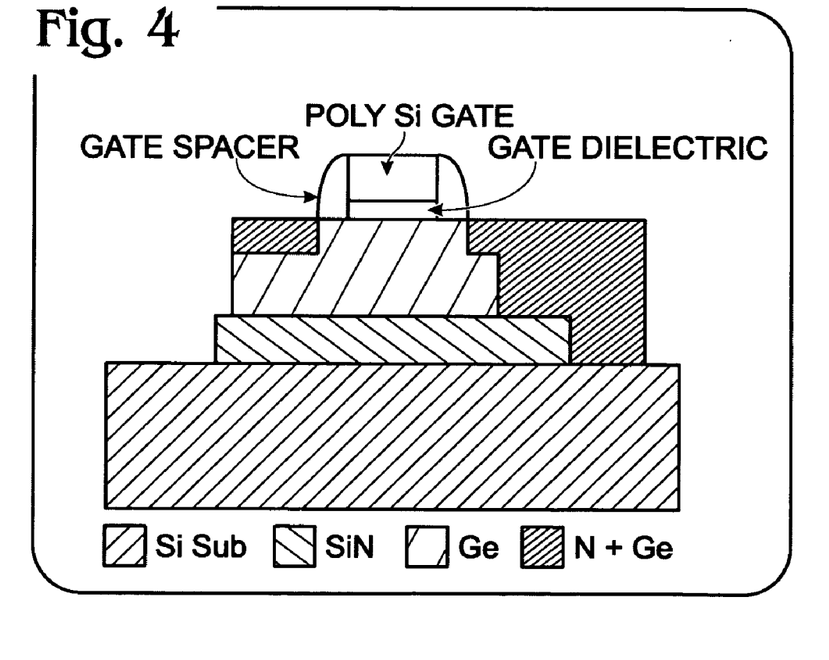
FIG. 4 is a partial cross-sectional view of the Ge phototransistor of FIG. 3, following the LPE process.

FIG. 4 is a partial cross-sectional view of the Ge phototransistor of FIG. 3, following the LPE process. After the Ge LPE process is completed, the overlying dielectric layer is selectively removed. For example, if silicon oxide is used as the dielectric, it can be removed in an HF-containing solution. A Ge MOS transistor is fabricated on the Ge single crystal epitaxial layer. The fabrication process steps are similar to any state-of-art Si CMOS process: channel ion implantation, gate dielectric deposition, gate material deposition, gate formation, gate spacer formation, and then source/drain formation. There are several steps in the process that may be further detailed.

(A) The Ge MOS transistor can be either NMOS or PMOS. An NMOS transistor is shown and described.

(B) The lightly doped drain (LDD) process that generally occurs prior to the spacer formation may be skipped. Eliminating of the LDD regions effectively increases the light absorption area.

(C) The gate dielectric, gate, and spacers are typically wide bandgap materials that do not absorb the infrared photons. The gate dielectrics can be $SiO_2$, $GeO_2$, $Al_2O_3$, $HfO_2$, $ZrO_2$, $TiO_2$, $Ta_2O_5$, or any kind of combination. The gate can be polysilicon and the spacers can be $SiO_2$ or $Si_3N_4$.

(D) A self aligned source/drain ion implantation, with As or P ions, is used. A shallow ion implantation is preferred to keep the S/D-to-body junction away from the $Ge/Si_3N_4$ interface.

An additional ion implantation (using N+ ions such as As or P) on the source side may be performed to electrically isolate the Ge body. If the Si substrate is being used to fabricate bottom devices, this deep implanted N+ Ge can be used as a local interconnection between the Ge device and Si bottom device. If a PMOS device was being made, then P+ ion implantations, using a material such as B, are performed.

Figure 5:
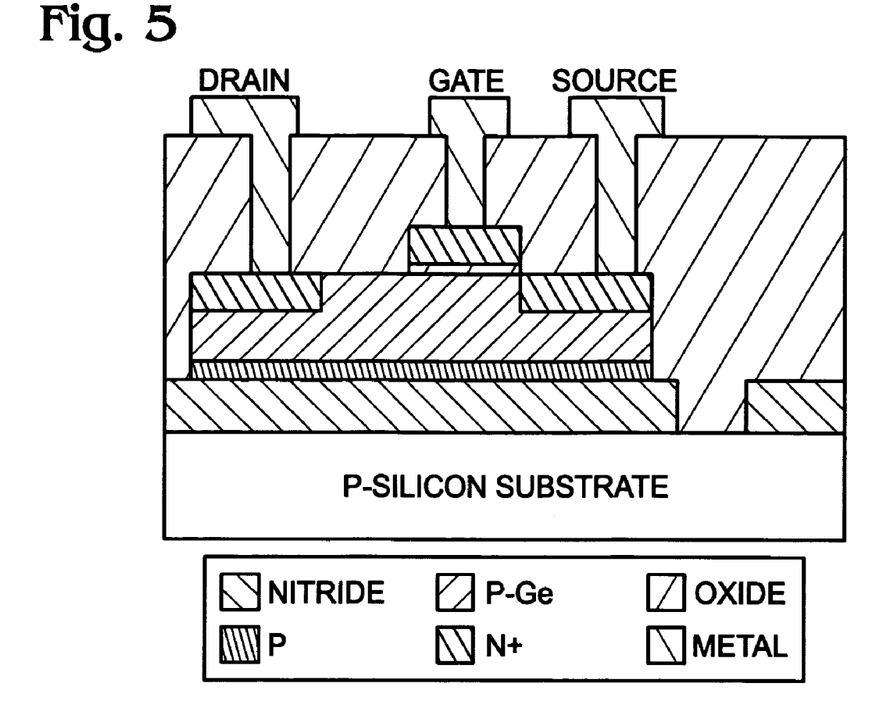
FIG. 5 is a partial cross-sectional view of a Ge-on-insulator (GOI) phototransistor device variation.

FIG. 5 is a partial cross-sectional view of a Ge-on-insulator (GOI) phototransistor device variation. The germanium phototransistor is fabricated on a p-type silicon substrate, or the p-well of a silicon integrated circuit substrate. The germanium at the nitride interface is moderately doped with boron. Both source and drain junctions are very shallow to avoid the depletion region reaching the high defect density at the germanium-to-nitride interface region. The detail structure and the operation of the device are apparent from the description of the fabrication process.

Figure 6:
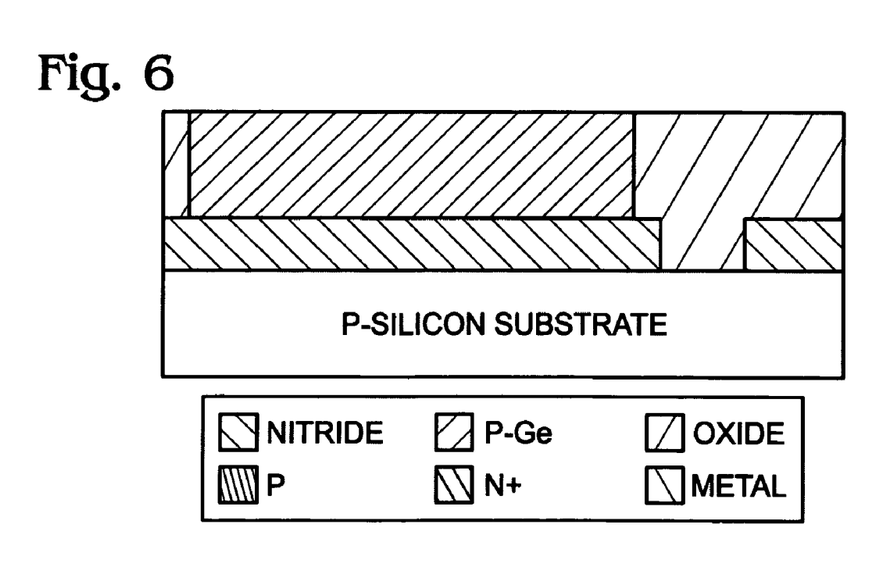
FIG. 6 depicts steps in the fabrication of the phototransistor of FIG. 5.

FIG. 6 depicts steps in the fabrication of the phototransistor of FIG. 5.

The device fabrication process is as follows:

1. Follow any desirable state-of-the-art silicon integration process to fabricate silicon CMOS for supporting electronics circuit. Save a p-substrate or p-well region for germanium phototransistor fabrication.

2. Deposit Ge and smooth the Ge film surface using the CMP process described below.

3. Fabricate a liquid phase epitaxy (LPE) germanium thin film over a silicon nitride, which has been formed on the silicon substrate. The thickness of germanium is typically no thinner than about 300 nm. Do not remove the top cover oxide.

4. Photoresist and etch the top cover oxide and germanium.

5. Deposit oxide. The oxide thickness is about 1 to 1.5 times as thick as the sum of the germanium and the cover oxide thicknesses.

6. CMP planarized the wafer. Do not completely remove the cover oxide. Wet etch to remove the remaining cover oxide.

7. Boron ion implant to dope the germanium film for threshold voltage adjustment, and deep boron ion implant to dope germanium at nitride interface p-doped region.

8. Use conventional processes to deposit gate oxide, form a gate electrode, and shallow source/drain arsenic ion implant. Oxide passivation and metallization steps occur next.

Since the depletion region of the source junction does not extend to the defect region at the bottom of the germanium layer near the silicon nitride, the leakage current at the source junction is small. The photo-generated holes can accumulated in the germanium film and effectively bias the germanium film to reduce the threshold voltage of the germanium phototransistor. Hence, the output current is increased. Near the silicon nitride, the germanium thin film is p-doped, which reduces the generation current and also prevents the drain depression region from reaching the silicon nitride interface.

FIGS. 3 through 6 illustrate a couple of examples of LPE Ge devices whose quality can be improved through the use of a CMP process prior to annealing. However, it should be understood that the present invention CMP is not limited to merely these examples. In fact, the invention is applicable to any Ge epitaxial film on insulator used in integrated circuit fabrication. The integrated circuit may be a Ge CMOS, detector, or sensor device. It can be a Ge Si hybrid circuit with Si CMOS as a core integrated circuit, and using Ge as detector, sensor, or high frequency portion of the CMOS integrated circuit.

FUNCTIONAL DESCRIPTION

As noted above, a silicon nitride insulator layer is deposited on a Si wafer, and then patterned to open windows for use as seed areas for liquid phase epitaxy growth. The silicon nitride layer thickness can be between 10 nm to 500 nm. Other materials can also be used as the substrate insulator. Ge is then deposited non-selectively. The Ge thickness can be between 20 nm to 1000 nm. In one aspect, the Ge is deposited by CVD at temperatures between 200° C. and 850° C. The Ge can be deposited in a single step, or using a multi-step deposition, where each layer is deposited at a different temperature. The surface (peak-to-valley) roughness of Ge films is at least 5 nm. As shown in FIGS. 1A through 2B, the surface roughness can be in the range of 50 to 90 nm.

Figure 7:
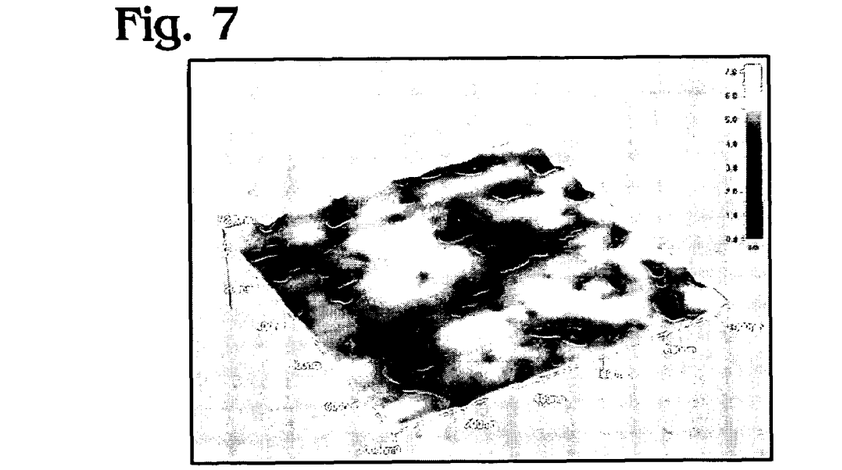
FIGS. 7 and 8 depicts the surface roughness of the CVD-deposited Ge films of FIGS. 1A and 1B following a CMP process.
Figure 8:
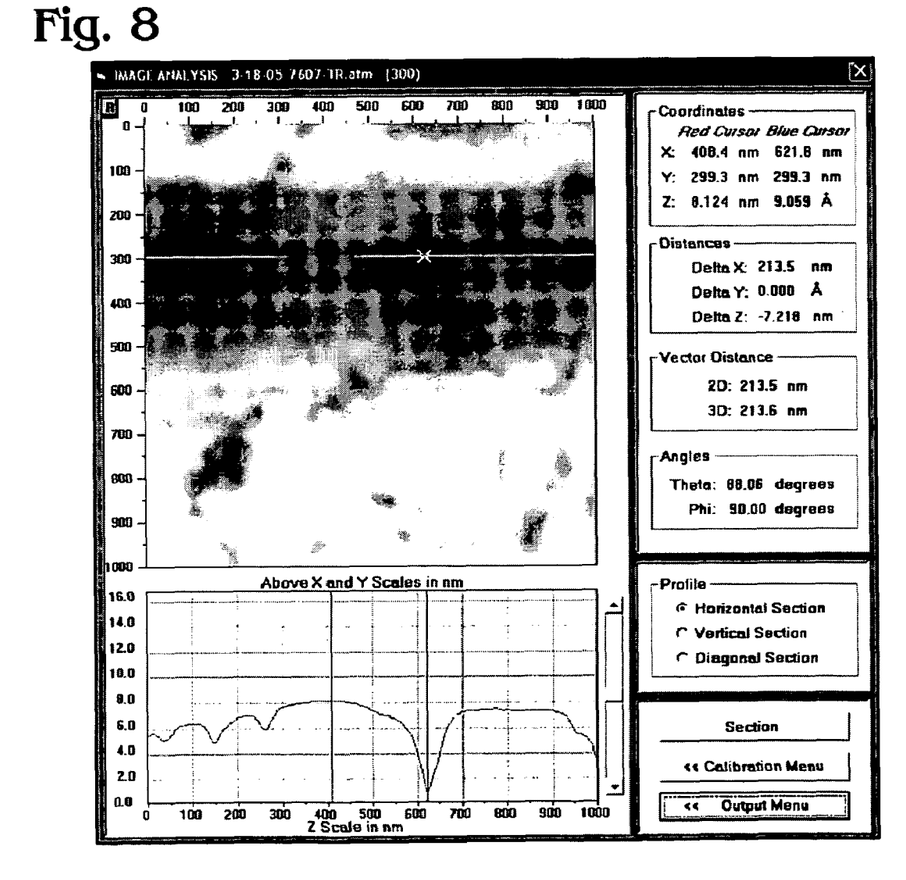

FIGS. 7 and 8 depicts the surface roughness of the CVD-deposited Ge films of FIGS. 1A and 1B following a CMP process. FIG. 7 is an atomic force micrograph (AFM) of a Ge film after CMP. Ge was deposited on nitride surface by chemical vapor deposition at about 260° C. The Ge thickness is about 170 nm before CMP. About an average thickness of 20 nm Ge was removed in CMP. The AFM of this film before polishing is shown in FIG. 1A. This Ge film was polished with a down force of 5 psi for 15 sec.

Chemical mechanical polishing of the CVD-deposited films reduces the roughness to less than 10 nm. The remaining roughness is not associated with polishing, but is a result of grooves at the grain boundaries. Although these grooves appear in the AFM micrographs as "pin hole" regions, the wall angle is actually very small, in the range of 5° to 10° from the surface flat. With optimization to completely remove these grooving marks, the surface roughness can be improved to be less than 5 nm. FIG. 8 is a line scan analysis of the AFM micrograph of the Ge after CMP. Only the residual topology of the grain boundaries remains after CMP. The peak-to-valley roughness is reduced from 50 nm, to about 7 nm.

The CMP process uses a colloidal silica slurry. One example of such as product is Kledosol® 1509-15. The down force is in the range of about 1 to 10 pounds-force per square inch (psi). In one aspect, the down force is between 2 to 5 psi.

Figure 9:
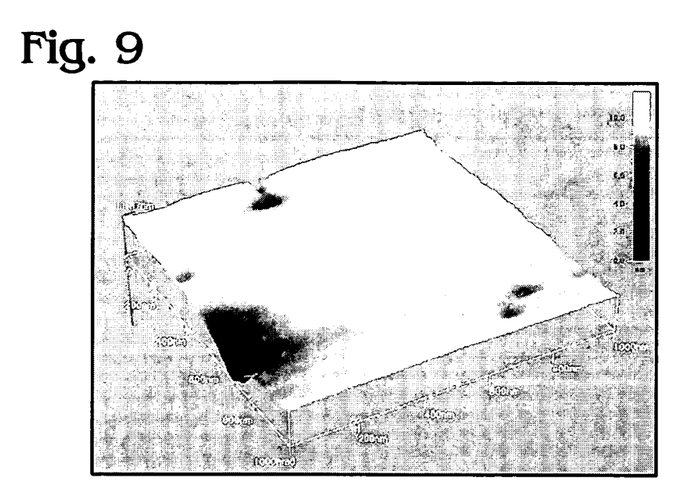
FIGS. 9 and 10 depict the Ge film of FIGS. 2A and 2B, following a CMP process.
Figure 10:
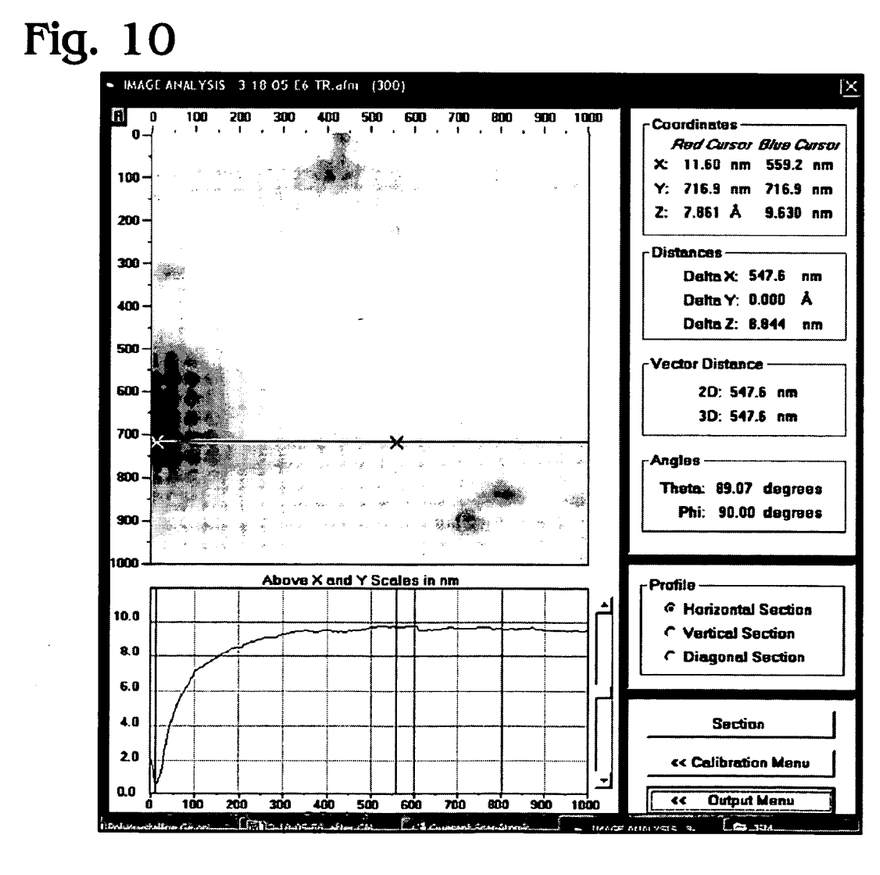

FIGS. 9 and 10 depict the Ge film of FIGS. 2A and 2B, following a CMP process. FIG. 9 is an AFM micrograph of a Ge film after CMP. 320 nm of Ge was deposited on nitride surface at about 520° C. After CMP, the thickness is about 260 nm. This Ge film was polished with down force of 2 psi for 2 min. FIG. 10 is a line scan analysis of the AFM after CMP. The slight roughness is caused by the grain boundary. The peak-to-valley roughness was reduced from more than 90 nm, to 9 nm.

The following steps, while generally applicable to many LPE Ge devices, are specifically directed to the GOI device described in METHOD OF EPITAXIAL GROWTH OF GERMANIUM PHOTODETECTOR FOR CMOS IMAGER, Lee et al., Ser. No. 11/069,424, filed Feb. 28, 2005, which is incorporated herein by reference.

Figure 11:
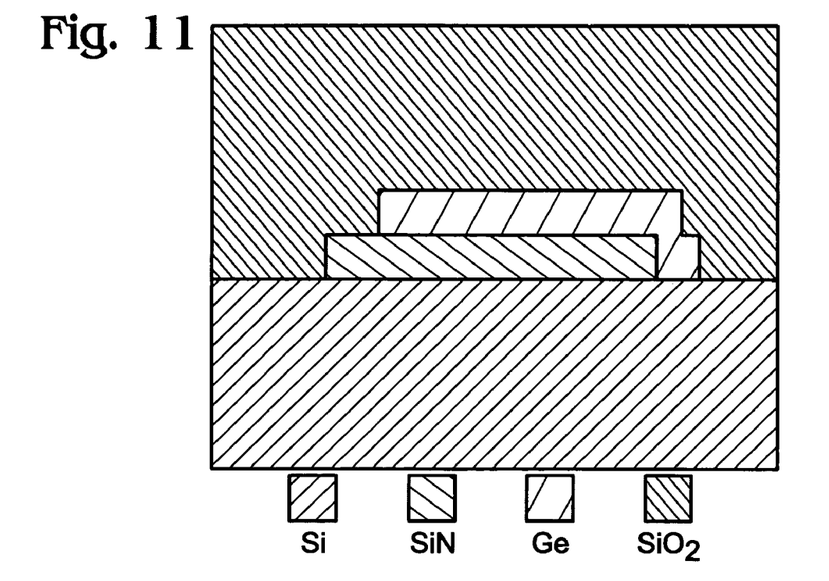
FIG. 11 is a partial cross-sectional view of a preliminary step in the fabrication of a GOI PIN photodetector.

FIG. 11 is a partial cross-sectional view of a preliminary step in the fabrication of a GOI PIN photodetector. The Ge film is patterned and etched into desired features. A small area in which Ge film is contacting the Si substrate, acts as a seed window for the epitaxial regrowth of Ge after melting.

A conformal silicon oxide dielectric layer (20 nm to 1000 nm) is deposited to encapsulate the Ge film. Rapid thermal annealing (RTA) is used to heat the wafer and melt the Ge film. The melting temperature for crystalline Ge is 938° C., so the RTA temperature is between 920° C. to 1000° C. During this anneal, the Ge film melts, and the SiN and $SiO_2$ films act as microcrucibles, holding the Ge liquid from flowing randomly. The Si substrate, $SiO_2$ and SiN remain solid. The wafer is then cooled. During cooling liquid phase epitaxy (LPE) occurs, the growth front moves from the Si/Ge interface in the seeding windows, and propagates laterally sweeping across the entire Ge strips. In this way single crystalline Ge is formed with defects concentrated and terminated only at the seeding window.

After the Ge LPE process is completed, the $SiO_2$ layer is selectively removed in an HF containing solution. The wafer is ready for Ge integrated circuit fabrication. Although a PIN device is used as an example, the process is equally applicable to NIP devices.

Photoresist is used as mask for $N^+$ and $P^+$ ion implantation. Following the ion implantation, the dopant is activated. The wafer is then passivated with oxide, followed by contact hole etching and final metallization.

Figure 12:
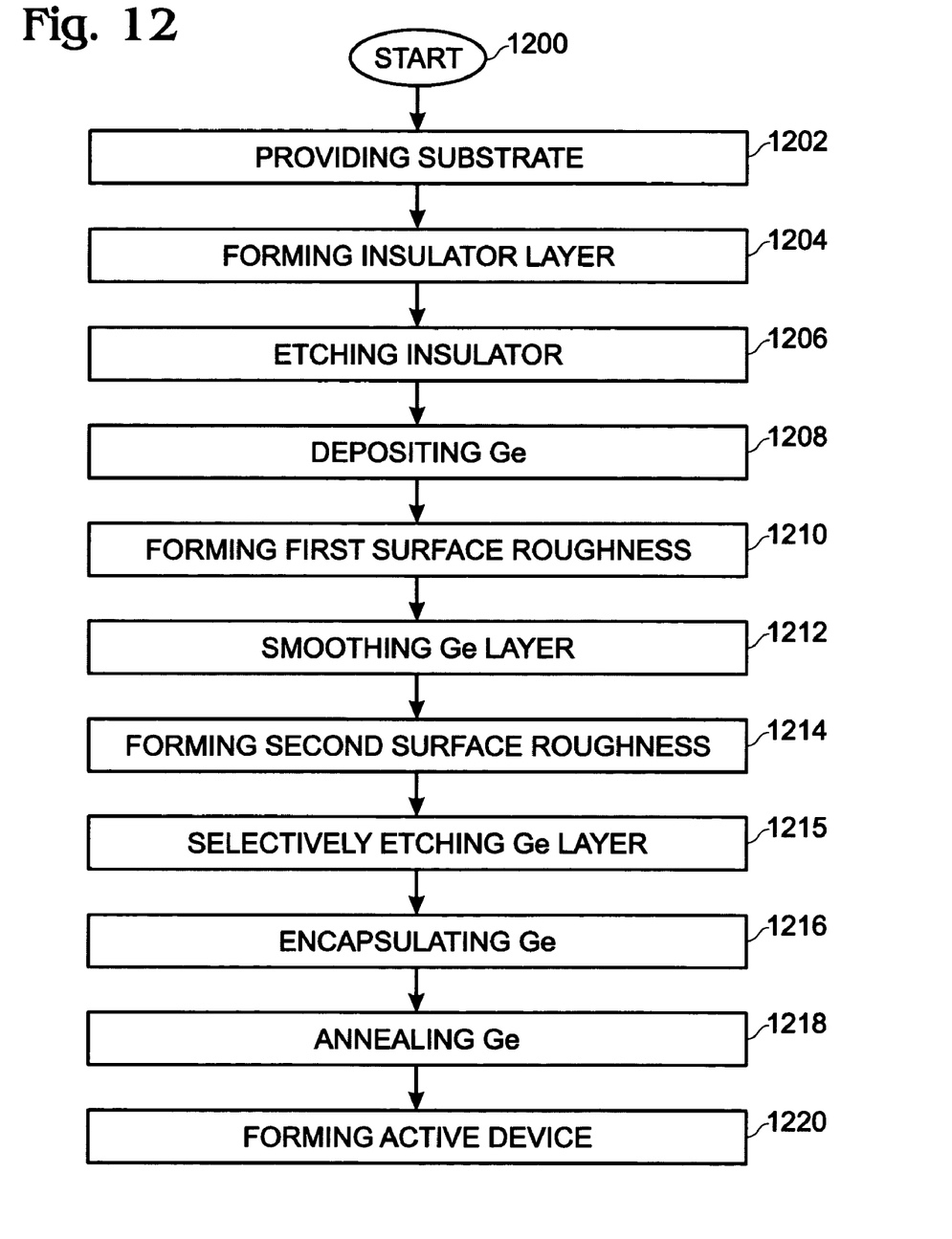
FIG. 12 is a flowchart illustrating a method for forming a LPE GOI thin-film with a smooth surface.

FIG. 12 is a flowchart illustrating a method for forming a LPE GOI thin-film with a smooth surface. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1200.

Step 1202 provides a silicon (Si) wafer. Step 1204 forms a silicon nitride insulator layer overlying the Si wafer. Step 1206 selectively etches the silicon nitride insulator layer, forming a Si seed access region. Step 1208 conformally deposits Ge overlying the silicon nitride insulator layer and Si seed access region. Step 1210 forms a Ge layer with a first surface roughness. Step 1212 smoothes the Ge layer using a CMP process. Step 1214 forms a Ge layer with a second surface roughness, less than the first surface roughness. Step 1215 selectively etches the Ge layer. Step 1216 encapsulates the Ge layer. Step 1218 anneals the Ge layer to form a LPE Ge layer. Step 1220 forms an active device in the LPE Ge layer. Generally, Step 1220 is intended to represent the final stages of device formation, such as the devices of FIGS. 3-6 and 11.

The Ge layer formed in Step 1210 typically has a thickness in the range of about 20 to 1000 nm and a surface roughness of greater than about 5 nm. Forming the Ge layer with the second surface roughness in Step 1214 includes forming a Ge layer with a surface roughness of less than about 5 nm. It should also be understood that the surface roughness of the Ge layer after the LPE process of Step 1218 is about equal to the second surface roughness.

In one aspect, smoothing the Ge layer in Step 1212 includes using a CMP process with a colloidal silica slurry. Typically, the colloidal silica slurry has a particle size of about 50 nm or less. In another aspect, the slurry is about 30% or less, solids, with a pH of about 9, or greater. In a different aspect, smoothing the Ge layer in Step 1212 includes using a CMP process with a down force in the range of about 1 to 10 pound-force per square inch (psi). In yet another aspect, Step 1212 removes a portion of the Ge layer surface in the range of about 20 to 300 nm.

In one aspect, conformally depositing Ge in Step 1208 includes depositing Ge using a process such as CVD, plasma-enhanced CVD, photo-assisted CVD, thermal CVD, physical vapor deposition (PVD), sputtering, evaporation, laser ablation, or molecular beam epitaxy (MBE). In a different aspect, Step 1208 deposits the Ge at a temperature in the range of about 200 and 850° C.

Figure 13:
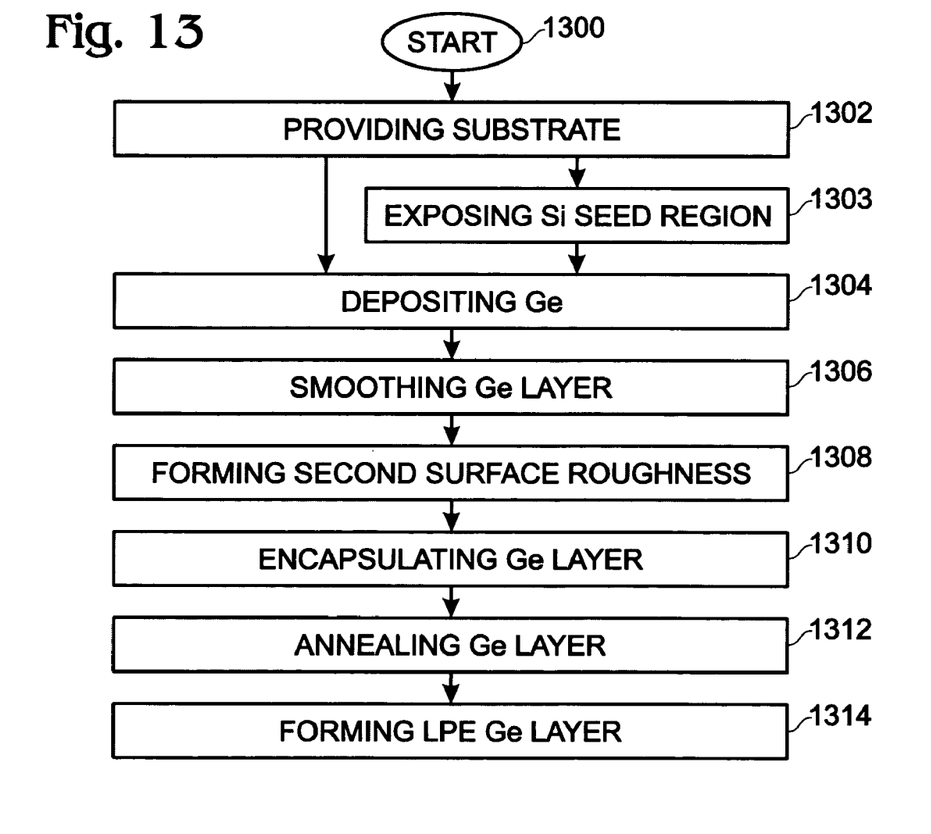
FIG. 13 is a flowchart illustrating a method for forming a Ge structure with a smooth surface.

FIG. 13 is a flowchart illustrating a method for forming a Ge structure with a smooth surface. The method starts at Step 1300. Generally, the process of FIG. 13 is broader than the process of FIG. 12, and describes the smoothing of amorphous, polycrystalline and single-crystal (LPE) Ge. Step 1302 provides a substrate. The substrate may be Si, plastic, glass, or quartz to name a few examples. Step 1304 conformally deposits a Ge layer with a first surface roughness overlying the substrate. As in the method of FIG. 12, the Ge can be deposited in a process such as CVD, plasma-enhanced CVD (PECVD), photo-assisted CVD, thermal CVD, PVD, sputtering, evaporation, laser ablation, or MBE. The deposition temperature is typically in the range of about 200 and 850° C.

Step 1306 smoothes the Ge layer with a CMP process using a colloidal silica slurry. As mentioned above, the colloidal silica slurry typically has a particle size of about 50 nm, or less, is about 30% or less, solids, and has a pH of about 9, or greater. In one aspect Step 1306 uses a CMP process with a down force in the range of about 1 to 10 psi. In another aspect, Step 1306, removes a portion of the Ge layer surface in the range of about 20 to 300 nm.

Step 1308 forms a Ge layer with a second surface roughness, less than the first surface roughness. For example, Step 1304 may form a Ge layer with a thickness in the range of about 20 to 1000 nm and a surface roughness of greater than about 5 nm. Then, Step 1308 forms a Ge layer with a surface roughness of less than about 5 nm.

In one aspect, the method of FIG. 13 can be extended to cover LPE Ge thin-films. In that case, Step 1302 provides a Si substrate. Step 1303 exposes the subsequently deposited Ge layer to a silicon seed region. After the smoothing in Step 1306, Step 1310 encapsulates the Ge layer. Step 1312 anneals the encapsulated Ge layer. Step 1314 forms a LPE Ge layer.

A method for smoothing the surface of an LPE Ge thin-film, for use in a GOI device such as a phototransistor, has been provided. Examples of specific devices have been provided to illustrate the invention. Specific process steps and materials have also been used as examples to illustrate the invention. However, the invention is not limited to merely these examples. Other variations and embodiments of the invention will occur to those skilled in the art.

We claim:

1. A method for forming a liquid phase epitaxial (LPE) germanium (Ge)-on-insulator (GOI) thin-film with a smooth surface, the method comprising:
    providing a silicon (Si) wafer;
    forming a silicon nitride insulator layer overlying the Si wafer;
    selectively etching the silicon nitride insulator layer, forming a Si seed access region;
    conformally depositing Ge overlying the silicon nitride insulator layer and Si seed access region;
    forming a Ge layer with a first surface roughness;
    smoothing the Ge layer using a chemical-mechanical polish (CMP) process; and,
    in response to the smoothing, forming a second surface roughness on the Ge layer, less than the first surface roughness.

2. The method of claim 1 further comprising:
    selectively etching the Ge layer;
    encapsulating the Ge layer;
    annealing the Ge layer to form a LPE Ge layer; and,
    forming an active device in the LPE Ge layer.

3. The method of claim 1 wherein forming the Ge layer with the first surface roughness includes forming a Ge layer with a thickness in the range of about 20 to 1000 nanometers (nm) and a surface roughness of greater than about 5 nm; and,
    wherein forming the second surface roughness on the Ge layer includes forming a Ge layer with a surface roughness of less than about 5 nm.

4. The method of claim 1 wherein smoothing the Ge layer includes using a CMP process with a colloidal silica slurry.

5. The method of claim 4 wherein using the CMP process with the colloidal silica slurry includes using a slurry with a particle size of about 50 nm or less.

6. The method of claim 5 wherein smoothing the Ge layer includes using a slurry that is about 30% or less, solids, with a pH of about 9, or greater.

7. The method of claim 1 wherein smoothing the Ge layer includes using a CMP process with a down force in the range of about 1 to 10 pound-force per square inch (psi).

8. The method of claim 1 wherein conformally depositing Ge includes depositing Ge using a process selected from the group consisting of chemical vapor deposition (CVD), plasma-enhanced CVD, photo-assisted CVD, thermal CVD, physical vapor deposition (PVD), sputtering, evaporation, laser ablation, and molecular beam epitaxy (MBE).

9. The method of claim 8 wherein depositing the Ge layer includes depositing the Ge at a temperature in the range of about 200 and 850° C.

10. The method of claim 1 wherein smoothing the Ge layer using the CMP process includes removing a portion of the Ge layer surface in the range of about 20 to 300 nm.

11. A method for forming a germanium (Ge) structure with a smooth surface, the method comprising:
 providing a substrate;
 conformally depositing a Ge layer with a first surface roughness overlying the substrate;
 smoothing the Ge layer with a chemical-mechanical polish (CMP) process using a colloidal silica slurry; and,
 in response to the smoothing, forming a second surface roughness on the Ge layer, less than the first surface roughness.

12. The method of claim 11 wherein using the CMP process with the colloidal silica slurry includes using a slurry with a particle size of about 50 nm, or less.

13. The method of claim 12 wherein using the CMP process with a colloidal slurry includes using a slurry that is about 30% or less, solids, with a pH of about 9, or greater.

14. The method of claim 11 wherein using the CMP process includes using a CMP process with a down force in the range of about 1 to 10 pound-force per square inch (psi).

15. The method of claim 11 further comprising:
 exposing the Ge layer to a silicon seed region;
 subsequent to smoothing the Ge layer, encapsulating the Ge layer;
 annealing the encapsulated Ge layer; and,
 forming a liquid phase epitaxial (LPE) Ge layer.

16. The method of claim 11 wherein depositing Ge includes depositing Ge using a process selected from the group consisting of chemical vapor deposition (CVD), plasma-enhanced CVD, photo-assisted CVD, thermal CVD, physical vapor deposition (PVD), sputtering, evaporation, laser ablation, and molecular beam epitaxy (MBE).

17. The method of claim 16 wherein depositing the Ge layer includes depositing the Ge at a temperature in the range of about 200 and 850° C.

18. The method of claim 11 wherein forming the Ge layer with the first surface roughness includes forming a Ge layer with a thickness in the range of about 20 to 1000 nanometers (nm) and a surface roughness of greater than about 5 nm; and,
 wherein forming the second surface roughness on the Ge layer includes forming a Ge layer with a surface roughness of less than about 5 nm.

19. The method of claim 11 wherein smoothing the Ge layer with the CMP process includes removing a portion of the Ge layer surface in the range of about 20 to 300 nm.

* * * * *